(12) United States Patent
Wang

(10) Patent No.: US 10,065,130 B2
(45) Date of Patent: Sep. 4, 2018

(54) THIN FILM SYSTEMS AND METHODS FOR USING SAME

(71) Applicant: EMPIRE TECHNOLOGY DEVELOPMENT LLC, Wilmington, DE (US)

(72) Inventor: Hao Wang, Beijing (CN)

(73) Assignee: EMPIRE TECHNOLOGY DEVELOPMENT LLC, Wilmington, DE (US)

(*) Notice: Subject to any disclaimer, the term of this patent is extended or adjusted under 35 U.S.C. 154(b) by 462 days.

(21) Appl. No.: 14/894,858

(22) PCT Filed: May 28, 2013

(86) PCT No.: PCT/CN2013/076316
§ 371 (c)(1),
(2) Date: Nov. 30, 2015

(87) PCT Pub. No.: WO2014/190484
PCT Pub. Date: Dec. 4, 2014

(65) Prior Publication Data
US 2016/0129367 A1    May 12, 2016

(51) Int. Cl.
*B01D 1/22* (2006.01)
*B01D 5/00* (2006.01)
(Continued)

(52) U.S. Cl.
CPC ............ *B01D 1/225* (2013.01); *B01D 5/006* (2013.01); *B01D 5/0024* (2013.01); *C02F 1/08* (2013.01);
(Continued)

(58) Field of Classification Search
CPC ...... B01D 1/225; B01D 5/0024; B01D 5/006; C02F 1/08
See application file for complete search history.

(56) References Cited

U.S. PATENT DOCUMENTS 2,538,540 A    1/1951  Thurman
2,823,742 A    2/1958  Ludin et al.
(Continued)

FOREIGN PATENT DOCUMENTS

CN    1048262 A    1/1991
CN    2139846 Y    8/1993
(Continued)

OTHER PUBLICATIONS

Multiple-effect distillation, accessed at http://web.archive.org/web/20111117012825/http://en.wikipedia.org/wiki/Multiple-effect_distillation, last modified on Sep. 11, 2011, pp. 3.
(Continued)

*Primary Examiner* — Renee Robinson
*Assistant Examiner* — Derek N Mueller

(57) ABSTRACT

Systems and methods for generating a thin film of a fluid are described. In an embodiment, a fluid support structure may be configured to receive a fluid, such as water, at a top surface and to support the fluid over at least a portion of the top surface. Channels may be formed in the top surface of the fluid support structure. Wiper blades may be configured to move over the top surface in contact with at least a portion of the fluid to form the fluid into a thin film. The wiper blades may include protrusions corresponding to the channels. As the wiper blades move over the top surface, the protrusions may move within the channels forming a thin film of the fluid within the channels. According to some embodiments, the fluid support structure may be configured as an evaporation surface configured to facilitate the evaporation of the fluid.

20 Claims, 8 Drawing Sheets

(51) Int. Cl.
  *C02F 1/08* (2006.01)
  *F28C 3/00* (2006.01)
  *H05K 7/20* (2006.01)
(52) U.S. Cl.
  CPC ......... *F28C 3/005* (2013.01); *H05K 7/20309* (2013.01)

(56) References Cited

U.S. PATENT DOCUMENTS

| | | |
|---|---|---|
| 3,136,707 A | 6/1964 | Hickman |
| 3,271,271 A | 9/1966 | Watt |
| 3,398,548 A | 8/1968 | Cox et al. |
| 3,554,263 A * | 1/1971 | Bachmann ............. B01D 1/225 159/13.2 |
| 3,764,483 A | 10/1973 | Tleimat |
| 3,795,587 A | 3/1974 | James |
| 4,094,170 A | 6/1978 | Kantor |
| 4,269,663 A | 5/1981 | McFee |
| 4,462,909 A | 7/1984 | Kennel |
| 4,832,114 A | 5/1989 | Yeh |
| 4,859,090 A | 8/1989 | Smith |
| 4,966,226 A | 10/1990 | Hamburgen |
| 5,211,812 A | 5/1993 | Vielberth et al. |
| 5,297,623 A | 3/1994 | Ogushi et al. |
| 5,409,576 A | 4/1995 | Tleimat |
| 5,441,102 A | 8/1995 | Burward-Hoy |
| 5,529,115 A | 6/1996 | Paterson |
| 5,810,975 A | 9/1998 | Bourdel |
| 5,878,808 A | 3/1999 | Rock et al. |
| 6,050,333 A | 4/2000 | Albaroudi |
| 6,111,748 A | 8/2000 | Bhatia |
| 6,241,009 B1 | 6/2001 | Rush |
| 6,408,937 B1 | 6/2002 | Roy |
| 6,668,911 B2 | 12/2003 | Bingler |
| 6,839,234 B2 | 1/2005 | Niwatsukino et al. |
| 7,055,581 B1 | 6/2006 | Roy |
| 7,224,585 B2 | 5/2007 | Lee et al. |
| 7,262,967 B2 | 8/2007 | Crocker et al. |
| 7,424,906 B2 | 9/2008 | Bhatti et al. |
| 7,427,336 B2 | 9/2008 | Zebuhr |
| 7,438,120 B2 | 10/2008 | Hong et al. |
| 7,481,263 B2 | 1/2009 | Breier et al. |
| 7,527,085 B2 | 5/2009 | Lijima et al. |
| 7,980,078 B2 | 7/2011 | McCutchen et al. |
| 8,944,150 B2 | 2/2015 | Wang |
| 9,207,023 B2 | 12/2015 | Koplow |
| 2002/0066283 A1 | 6/2002 | Oh et al. |
| 2002/0101717 A1 | 8/2002 | Lin |
| 2003/0159458 A1 | 8/2003 | Fang et al. |
| 2003/0209419 A1 | 11/2003 | Tonkin et al. |
| 2003/0213585 A1 | 11/2003 | Reznik |
| 2004/0052049 A1 | 3/2004 | Wu et al. |
| 2005/0024830 A1 | 2/2005 | Lee et al. |
| 2005/0205408 A1 | 9/2005 | Marsh et al. |
| 2007/0089859 A1 | 4/2007 | Wei |
| 2007/0144199 A1 | 6/2007 | Scott |
| 2008/0142195 A1 | 6/2008 | Erturk et al. |
| 2010/0025015 A1 | 2/2010 | Wang |
| 2010/0025021 A1 | 2/2010 | Wang |
| 2010/0053884 A1 | 3/2010 | Hung et al. |
| 2012/0037488 A1 | 2/2012 | Zebuhr |
| 2012/0279685 A1 | 11/2012 | Yu |
| 2016/0129367 A1 | 5/2016 | Wang |

FOREIGN PATENT DOCUMENTS

| | | |
|---|---|---|
| CN | 1408647 A | 4/2003 |
| CN | 1652328 A | 8/2005 |
| CN | 101043806 A | 9/2007 |
| CN | 101053697 A | 10/2007 |
| CN | 201242360 Y | 5/2009 |
| CN | 101646327 A | 2/2010 |
| CN | 101646328 A | 2/2010 |
| CN | 201658856 U | 12/2010 |
| CN | 101936668 A | 1/2011 |
| CN | 201945200 U | 8/2011 |
| FR | 2452302 A1 | 10/1980 |
| GB | 1355933 A | 6/1974 |
| GB | 1505674 | 3/1978 |
| JP | 60253790 A | 12/1985 |
| JP | 2006281083 A | 10/2006 |
| JP | 2007064532 A | 3/2007 |
| WO | 9505227 A1 | 2/1995 |
| WO | 0187462 A1 | 11/2001 |
| WO | 2004094932 A1 | 11/2004 |
| WO | 2009073929 A1 | 6/2009 |
| WO | 2011004416 A1 | 1/2011 |
| WO | 2012012397 A2 | 1/2012 |

OTHER PUBLICATIONS

Wiper System, accessed at http://web.archive.org/web/20130302074221/http://www.uic-gmbh.de/en/basics/wiper-system.html, accessed on Dec. 2, 2015, pp. 2.
International Search Report and Written Opinion for International Application No. PCT/CN2013/076316 dated Mar. 6, 2014.
International Search Report and Written Opinion for International Application No. PCT/CN2011/072909 dated Jan. 12, 2012.
Wang et al., Numerical investigation of heat and mass transfer from an evaporating meniscus in a heated open groove, International Journal of Heat and Mass Transfer, vol. 54, Issue 13-14, pp. 3015-3023 (Jun. 2011).
Wang et al., Transport from a volatile meniscus in a microtube, International Journal of Heat and Mass Transfer, vol. 51, Issue 11-12, pp. 3007-3017 (Jun. 2008).
International Search Report and Written Opinion for International Application No. PCT/CN2013/076304 dated Mar. 13, 2014, pp. 11.
International Search Report and Written Opinion for International Application No. PCT/CN2013/076307 dated Mar. 6, 2014, pp. 8.
International Search Report and Written Opinion for International application No. PCT/CN2013/076316, dated Mar. 6, 2014.

* cited by examiner

THIN FILM SYSTEMS AND METHODS FOR USING SAME

CLAIM OF PRIORITY

This application is a U.S. national stage filing under 35 U.S.C. § 371 of International Application No. PCT/CN2013/076316 filed on May 28, 2013 entitled "THIN FILM SYSTEMS AND METHODS FOR USING AND MAKING SAME," which is incorporated herein by reference in its entirety.

BACKGROUND

Evaporation-condensation heat transfer systems operate through an evaporation-condensation cycle that facilitates the movement of heat between two surfaces. These heat transfer systems include a heated evaporation surface that evaporates a fluid into a vapor. The vapor travels toward a condensation surface having a temperature that is cool enough to condense the vapor into a liquid. Evaporation-condensation heat transfer systems are used by processes such as water desalination, oil refining and industrial cooling for various purposes, including reducing unwanted heat or removing certain particles from a liquid.

A factor in the efficiency of evaporation-condensation heat transfer systems is the evaporation rate of the fluid. For example, if the evaporation surface is larger or if more heat is applied to the fluid, more fluid may be evaporated per unit of time. However, merely increasing the size of an evaporation surface or an evaporative heater may not improve the overall effectiveness of the system due to size, material and/or cost restrictions. In addition, conventional evaporation surfaces do not proficiently scale beyond certain limitations of the particular evaporation-condensation heat transfer system, such as the type of evaporation surface heater or the size of the chamber housing the evaporation-condensation cycle. Accordingly, evaporation-condensation heat transfer systems would benefit from improved evaporation surfaces that increase evaporation efficiency without requiring an increase in the size of the evaporation surface or the amount of heat required to achieve evaporation.

SUMMARY

In an embodiment, thin film systems configured to form a this film of a fluid to promote evaporation of the fluid may comprise an evaporation structure and at least one wiper blade configured to move over a top surface of the evaporation structure The evaporation structure may be configured to facilitate evaporation of a fluid on the top surface and within at least one channel formed within the top surface. The at least one wiper blade may comprise at least one protrusion corresponding to the at least one channel and may be configured to move over the top surface with at least a portion of the at least one protrusion moving within the at least one channel. The at least one wiper blade and the at least one protrusion may be arranged to be in contact with at least a portion of the fluid to form a thin film of the fluid on the top surface and within the at least one channel.

In an embodiment, a thin film vapor condensation system may comprise a source of a fluid, at least one condensation surface configured to facilitate condensation of fluid vapor thereon, and at least one evaporation structure configured to facilitate evaporation of the fluid on a top surface thereof and within at least one channel formed within the top surface. The thin film vapor condensation system may also include at least one wiper blade comprising at least one protrusion corresponding to the at least one channel. The at least one wiper blade may be configured to move over the fop surface with at least a portion of the at least one protrusion moving within the at least one channel. The at least one wiper blade and the at least one protrusion may be arranged to be in contact with at least a portion of the fluid to form a thin film of the fluid on the top surface and within the at least one channel. At least one heater may be configured to heat the thin film of fluid to generate a flow of fluid vapor toward the at least one condensation surface for condensation thereon.

In an embodiment, a method of forming a thin film of a fluid to promote evaporation of the fluid may comprise providing an evaporation structure configured to facilitate evaporation of a fluid on a top surface thereof and within at least one channel formed within the top surface and providing at least one wiper blade comprising at least one protrusion corresponding to the at least one channel. The at least one wiper blade may be positioned such that the at least one wiper blade is in contact with at least a portion of the fluid and at least a portion of the at least one protrusion is located within the at least one channel in contact with at least a portion of the fluid. The fluid may be received at the evaporation structure and the at least one wiper blade may be moved over the top surface and the at least one protrusion moved within the at least one channel to form a thin film of the fluid on the top surface and within the at least one channel.

In an embodiment, a method of manufacturing a thin film system configured to form a thin film of a fluid to promote evaporation of the fluid may comprise providing an evaporation structure comprising atop surface and configured to facilitate evaporation of a fluid thereon and forming at least one channel within the top surface configured to facilitate evaporation of the fluid therein. At least one wiper blade may be provided comprising at least one protrusion corresponding to the at least one channel. The at least one wiper blade may be configured to move over the top surface with at least a portion of the at least one protrusion moving within the at least one channel. The at least one wiper blade and the at least one protrusion may be positioned to be in contact with at least a portion of fluid received at the evaporation structure to form a thin film of the fluid on the top surface and within the at least one channel.

In an embodiment, a thin film system configured to form a thin film of a fluid to promote evaporation of the fluid may comprise an evaporation structure configured to facilitate evaporation of a fluid on a top surface thereof and at least one wheel-belt structure. The wheel belt structure may comprise a first wheel configured to rotate about a first axis, a second wheel configured to rotate about a second axis, a belt wound around the first wheel and the second wheel. The belt may comprise at least one brush protruding from an outer surface thereof and extending toward the top surface. A driving element may be configured to rotate the first wheel, thereby causing the belt to rotate about the first wheel and the second wheel such that the second wheel rotates. Rotation of the belt may cause the at least one brush to rotate about a path formed by the belt in contact with at least a portion of the fluid to form a thin film of the fluid on the top surface.

DETAILED DESCRIPTION

Figure 1A:
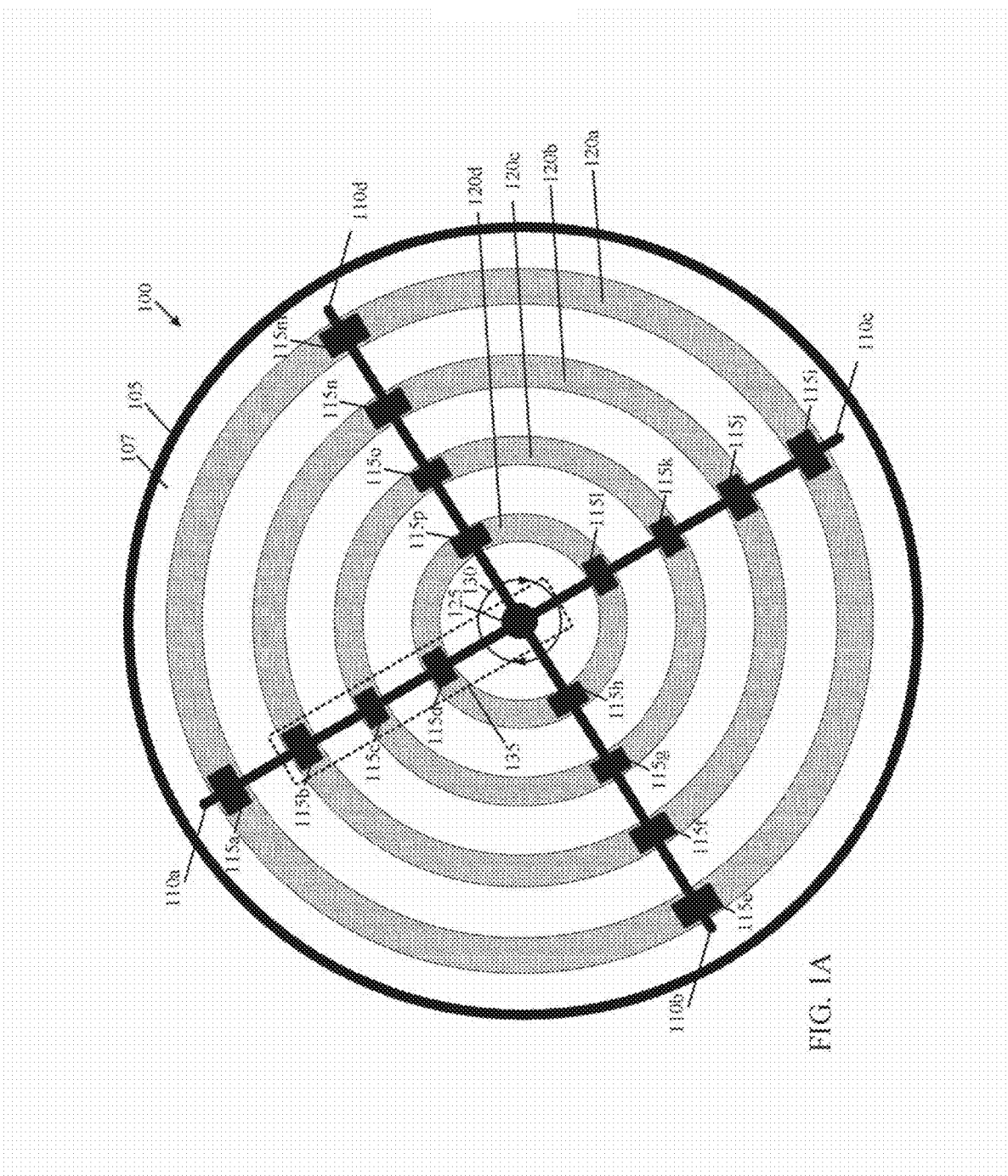
FIG. 1A depicts a top-view of an illustrative thin film system according to a first embodiment.

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

The present technology relates generally to systems and methods for producing a thin, film of a fluid. In particular, embodiments provide a fluid support structure including a surface configured to hold a fluid dispersed over at least a portion thereof. One or more wiper blades may be configured to move over the surface of the fluid-support structure in contact with at least a portion of the fluid to form a thin film of the fluid on the surface. The thin film of fluid may be used in various processes, such as evaporation-dependent processes, manufacturing processes, material treating processes, material coating processes, or the like, in which at least a portion of the process may use a thin film of a fluid, such as water, a solvent, a coating material, or combinations thereof.

According to some embodiments, the surface of the fluid support structure may include one or more channels formed therein. The channels may be configured to, among other things, provide more surface area for the fluid, to be distributed over the surface of the fluid-support structure. In an embodiment, the one or more wiper blades may include protrusions configured to move within the one or more channels. The protrusions may move within the channels as the wiper blades move over the surface in contact with at least a portion of the fluid to form a thin film of the fluid within the channels. In this manner, the total surface area available to support the fluid may be increased without increasing the dimensions (for example, increasing the circumference for a circular fluid-support structure or the length and/or the width of a quadrilateral-shaped fluid-support structure) of the surface of the fluid support structure.

In an embodiment, the fluid support structure may be configured as an evaporation structure including a top surface formed to support a layer of fluid thereon. The fluid formed into a thin film may evaporate more efficiently because, among other things, the thin film allows for a more even distribution of the fluid over the top surface and a larger overall exposed surface area of the fluid, for example, that may be exposed to a heat source and/or other factors that facilitate evaporation. In addition, the thin film allows the fluid to be spread out over a larger area and to use a larger area of the evaporation surface for evaporation. An evaporation structure configured according to some embodiments described herein may be included in various evaporation-dependent systems, such as a phase change system, evaporation-condensation system, or the like. Particular evaporation-dependent systems include, without limitation, heat, pipes, vapor chambers, condensers, capillary-pumped loops, desalination systems, distillation systems, separation systems (for example, chemical separation systems), and electronics cooling systems.

FIG. 1A depicts a top-view of an illustrative thin film system according to a first embodiment. As shown in FIG. 1A, a thin film system 100 may include a fluid support structure 105 having a top surface 107 configured to support a fluid. The top surface 107 may have channels 120a-120d formed therein. The fluid support structure 105 may receive a fluid from a fluid source (not shown) and the fluid may be dispersed over at least a portion of the top surface 107 and may enter the channels 120a-120d.

The fluid may include various fluids selected based on certain factors, such as the process using the thin film system 100, the configuration of the fluid support structure 105, cost considerations, resource considerations, or the like. Illustrative and non-restrictive examples of fluids include water, ammonia, refrigeration fluids (for example, R134a, R410A, R407C, R417A, R404A, R507, R23, R22), hydrocarbons, methanol, ethanol, acetone, petroleum distillates, benzene, and toluene. Water, for example, may be one or more of the following: ground water, industrial water effluent, drinking water, rain water, brackish water, surface water, mineral water, salt water, sea water, fresh or substantially fresh water, distilled water, deionized water, and combinations thereof.

Figure 1B:
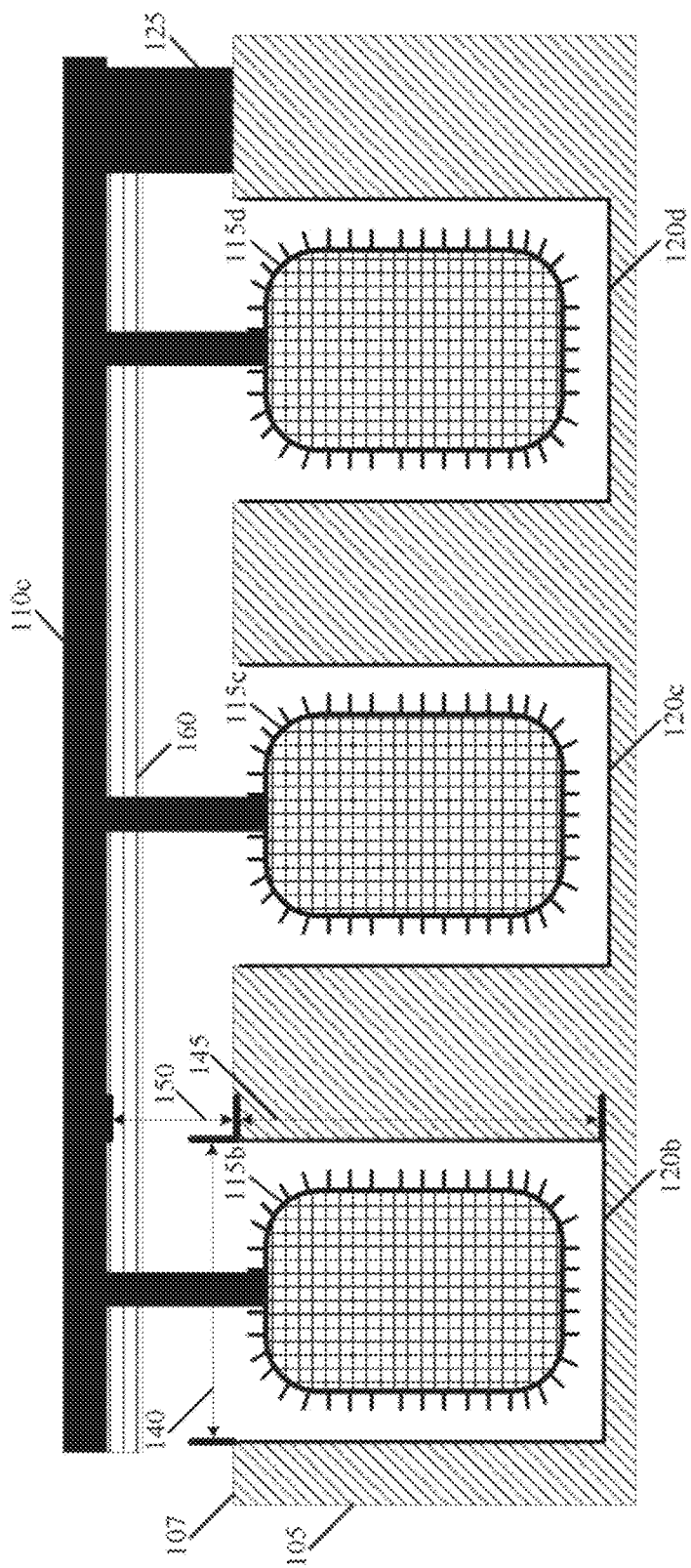
FIG. 1B depicts a cross-sectional view of a portion of a thin film system configured according to the first embodiment.

Wiper blades 110a-110d may be configured to rotate (e.g., 130) over the top surface 107 of the fluid support surface 105 around a central axis 125. For example, the wiper blades 110a-110d may be operatively coupled to the central axis 125, which is mechanically coupled to a driving element (not shown), such as a motor, configured to rotate the central axis and, therefore, the wiper blades. Each of the wiper blades 110a-110d may include protrusions 115a-115p configured to move within the channels 120a-120d as the wiper blades rotate over the top surface 107. A more detailed view of the protrusions 115a-115p within the channels 120a-120d is depicted in FIG. 1B, which shows a detailed, cross-sectional view of the area 135 of the thin film system 100 bounded by the dotted lines. The wiper blades 110a-110d may be configured to rotate at various speeds depending on certain factors, such as the type of fluid, evaporation rate, or the like. In an embodiment, the wiper blades 110a-110d may be configured to rotate at about 5 revolutions per minute, about 10 revolutions per minute, about 25 revolutions per minute, about 50 revolutions per minute, about 100 revolutions per minute, about 200 revolutions per minute, about 500 revolutions per minute, and ranges between any two of these values (including endpoints). In an embodiment, the thin film system 100 may use only one wiper blade 110a-

110d. In other embodiments, the thin film system 100 may use 2, 3, 4, 5, or 6 blades 110a-110d.

The wiper blades 110a-110d may be arranged such that at least a portion of the wipers contacts at least a portion of the link dispersed on the top surface 107. In an embodiment, at least a portion, of the wiper blades 110a-110d may contact at least a portion of the top surface 107. In another embodiment, at least a portion of the wiper blades 110a-110d may contact at least a portion of the top surface 107 during certain portions of the movement of the wiper blades over the top surface.

The fluid dispersed on the top surface 180 may have a particular film thickness and may cover a particular percentage of the surface area of the top surface. As the wiper blades 110a-110d rotate, the wipers contact at least a portion of the fluid, thereby spreading the fluid out info a thin film. The thickness of the film of fluid can therefore decrease (see FIGS. 2A and 2B for a more detailed depiction of the formation of a thin film) and the fluid can be distributed over a larger percentage of the surface area of the top surface 207. In addition, as the protrusions 115a-115p move/within the channels 120a-120d, the protrusions contact at least a portion of the fluid within the channels and form a thin film of the fluid therein. In this manner, as the wiper blades 110a-110d rotate, a thin film of the fluid is formed on the top surface 107 and within the channels 120a-120d.

The thickness and coverage of the fluid and the thickness and coverage of the thin film resulting from rotation of the wiper blades may have any value capable of operating according to some embodiments described herein. For example, the thickness of the thin film may depend on the type of fluid, the process using the thin film system, the dimensions of the thin film system (for example, a desalination facility versus a computing device cooling system), and combinations thereof. In an embodiment, the wiper blades 110a-110d may be configured to form a thin film having a thickness of about 10 nanometers, about 100 nanometers, about 500 nanometers, about 0.1 millimeters, about 1 millimeter, about 10 millimeters, about 100 millimeters, and ranges between any two of these values (including endpoints). In another embodiment, the wiper blades 110a-110d may be configured to form a thin film having a thickness of about 100 millimeters, about 500 millimeters, about 1 centimeter, about 3 centimeters, about 5 centimeters, about 10 centimeters, and ranges between any two of these values (including endpoints).

The fluid support structure 105 and components thereof, such as portions of the top surface 107, the wiper blades 110a-110d, and the protrusions 115a-115p, may be formed from various materials. According to some embodiments, the materials may be configured to be resistant to corrosion to the particular fluid used in the thin film system 100, to facilitate the formation of the thin film, to facilitate the process using the fluid support structure 105 (for example, evaporation), and combinations thereof. Non-limiting examples of such materials include metals (far example, steel, carbon steel, low allow steel, aluminum, nickel, cadmium, combinations thereof, and alloys thereof), ceramics, plastics (for example, polyvinyl chloride), rubber, and combinations thereof.

In an embodiment, the thin film system 100 may be configured as a component of an evaporation-dependent process, such as a heat pipe, a condenser, a vapor chamber, a desalination system, capillary-pumped loop, a distillation system, a chemical separation system, and an electronics cooling system (for example, a computing device central processing unit cooling system). In these embodiments, the fluid support structure 105 may be configured as an evaporation structure configured to facilitate evaporation of the fluid on the top surface 107 and within the channels 120a-120d, for example, through the use of a heater (not shown) configured to heat the fluid.

FIG. 1B depicts a cross-sectional view of a portion, of a thin film system configured according to a first embodiment. In particular, FIG. 1B depicts a cross-sectional view of the area 135 of FIG. 1A bounded by the dotted lines. The channels 120b-120d may be configured with various dimensions, such as a width 140 and a depth 145. In an embodiment, the width 140 of the channels 120b-120d may be about 10 nanometers, 0.1 millimeters, about 1 millimeter, about 1 centimeter, about 10 centimeters, about 50 centimeters, about 1 meter, about 10 meters, and ranges between any two of these values (including endpoints). In an embodiment, the depth 145 of the channels 120b-120d may be about 10 nanometers, 0.1 millimeters, about 1 millimeter, about 1 centimeter, about 10 centimeters, about 50 centimeters, about 1 meter, about 10 meters, and ranges between any two of these values (including endpoints). In an embodiment, all of the channels 120b-120d may have the same dimensions, in another embodiment, at least a portion of the channels 120b-120d may have different dimensions (for example, inner channels may have a greater width than outer channels, or the like).

As shown in FIG. 1B, the wiper blade 110c may be arranged to be a distance 150 from the top surface 107. The distance 150 may be configured based on various factors, such as the type of fluid, the dimensions of the thin film system 100 and components thereof the desired thickness of the thin film, or the like. In an embodiment, the wiper blade 110c may include an edge 160 positioned at a lower portion of the wiper blade. The edge 160 may operate, among other things, to facilitate the formation of the thin film. In an embodiment, the edge 160 may be formed from an elastic, flexible or semi-flexible material such as rubber, or a rubber-based or amber-like material. In another embodiment, the edge 160 may be formed from a fluid-absorbent material, such as a sponge-like material. The protrusions 115b-115d may be configured into various formations, such as solid, semi-solid, porous, or the like. For example, in an embodiment, the protrusions 115b-115d may be formed from porous brush, fiber brush, rubber brush, bristled, mesh, and/or sponge material portions. In these embodiments, the porous brush, fiber brush, bristled, mesh, and/or sponge material portions may be configured, among other things, to prevent drying out of the fluid within the channels 120a-120d. In some embodiments, at least a portion of the wiper blade 110c may be formed from porous brush, fiber brush, bristled, mesh, and/or sponge material portions.

The protrusions 115b-115d may be arranged in the channels 120a-120d according to different configurations. For example, the protrusions 115b-115d may be arranged entirely within the channels 120a-120d, with at least a portion of the protrusions extending outside of the channels, with at least a portion of the protrusions contacting at least a portion of the channels (for example, the bottom and/or a side-wall of the channels), at an angle relative to the channel walls and/or the wiper blade 110c, or combinations thereof.

Figure 1C:
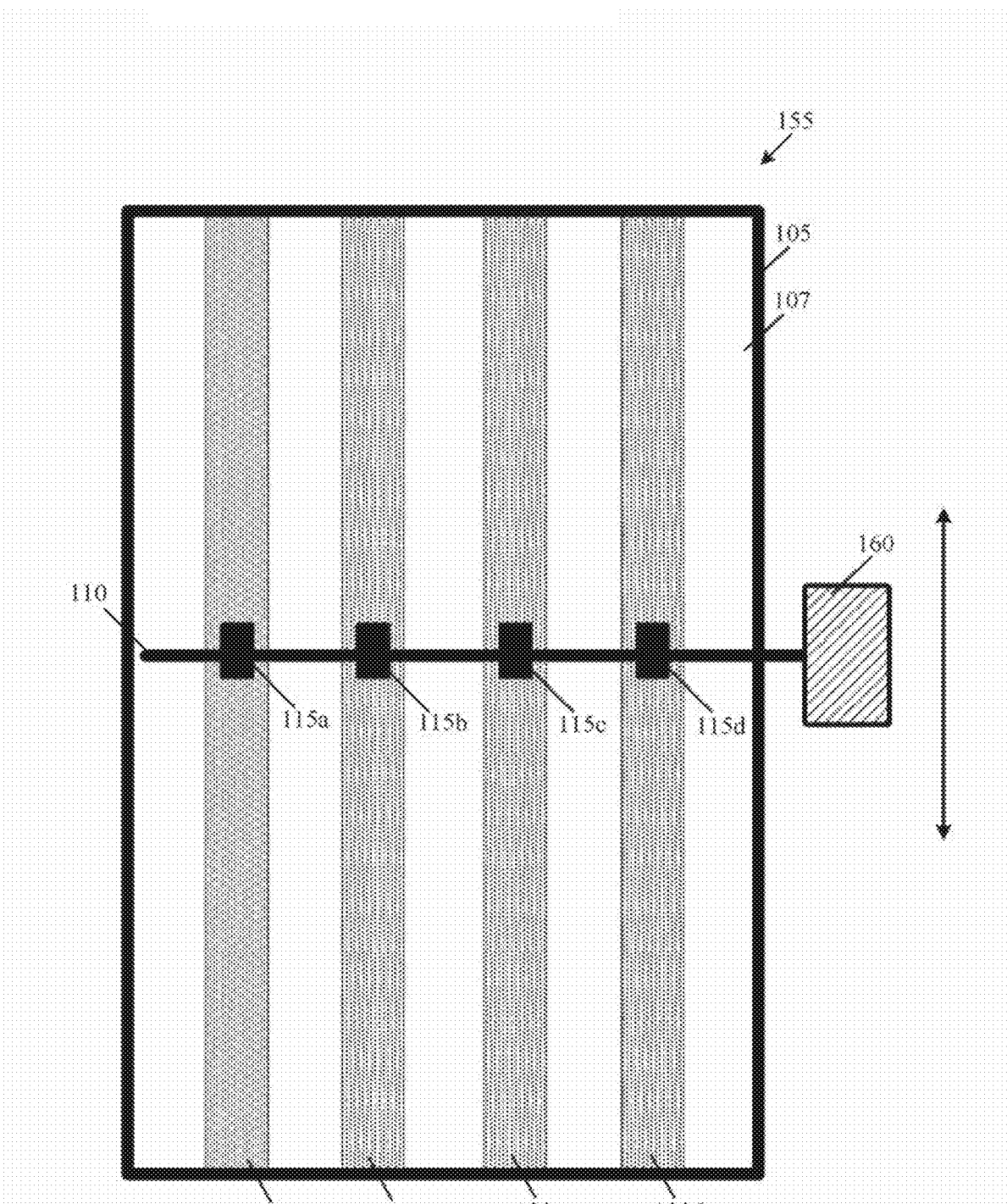
FIG. 1C depicts an illustrative thin film system according to a second embodiment.

FIG. 1C depicts an illustrative thin film system according to a second embodiment. As shown in FIG. 1C, a thin film system 155 may include a quadrilateral-shaped fluid support structure 105 having channels 120a-120d arranged in a top surface 107 thereof. A wiper blade 110 may be configured to move over the top surface 107 using a blade driving component 160, such as a motor, belt system, or the like. The wiper blade 110 may include protrusions 115a-115d configured to move within the channels 120a-120d as the wiper blade moves over the top surface 107. The fluid support structure 105 may be configured to receive a fluid. As the wiper blade 110 moves over the top surface 107 and the protrusions 115a-115d move within the channels 120a-120d, the fluid may be formed into a thin film on the top surface and within the channels. As indicated by FIGS. 1A and 1C, the fluid support structure 105 is not limited by shape or size, and may be any shape or size suitable for fluid support structures capable of operating according to some embodiments described herein.

Figure 2A:
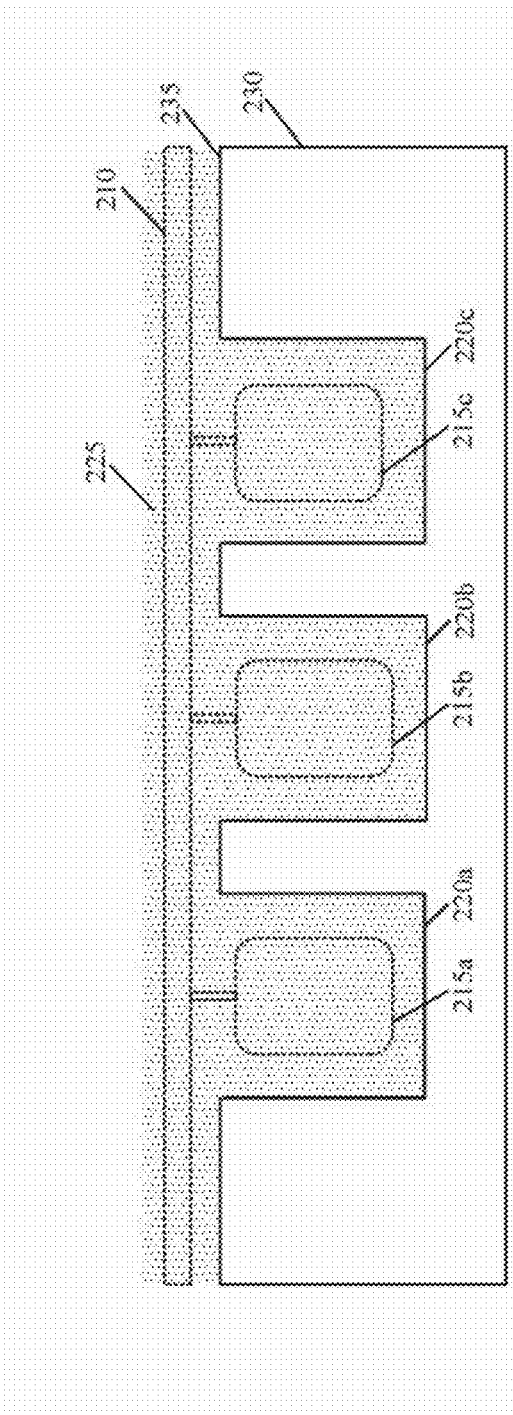
FIGS. 2A and 2B depict an illustration of thin film formation according to some embodiments.
Figure 2B:
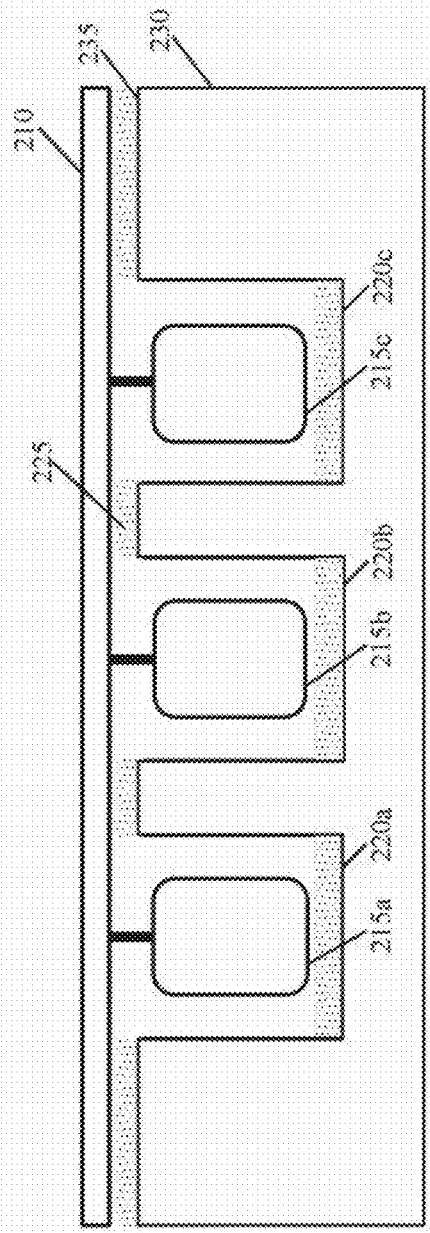

FIGS. 2A and 2B depict an illustration of thin film formation according to some embodiments. As shown in FIG. 2A, a fluid support structure 235 may include a top surface 230 having channels 220a-220c arranged therein. A fluid 225 may be dispersed over the top surface 230 and within the channels 220a-220c. A wiper blade 210 may be arranged over the top surface 230 and may have protrusions 215a-215c extending therefrom and into the channels 220a-220c. The arrangement of the fluid 225 depicted in FIG. 2A is for illustrative purposes only, for example, showing that the fluid may have a certain thickness without operation of the wiper blade 210. FIG. 2B depicts the formation of the fluid 225 into a thin film after and/or during movement of the wiper blade 210 over the top surface 230 and the protrusions 215a-215c within the channels 220a-220c. As illustrates by FIG. 2B, movement of the wiper blade 210 over the top surface 230 and protrusions 215a-215c within the channels 220a-220c may operate to force the fluid 225 into a thin film arrangement having a thickness less than the thickness of the fluid without movement of the wiper blade over the top surface and protrusions within the channels.

Figure 3:
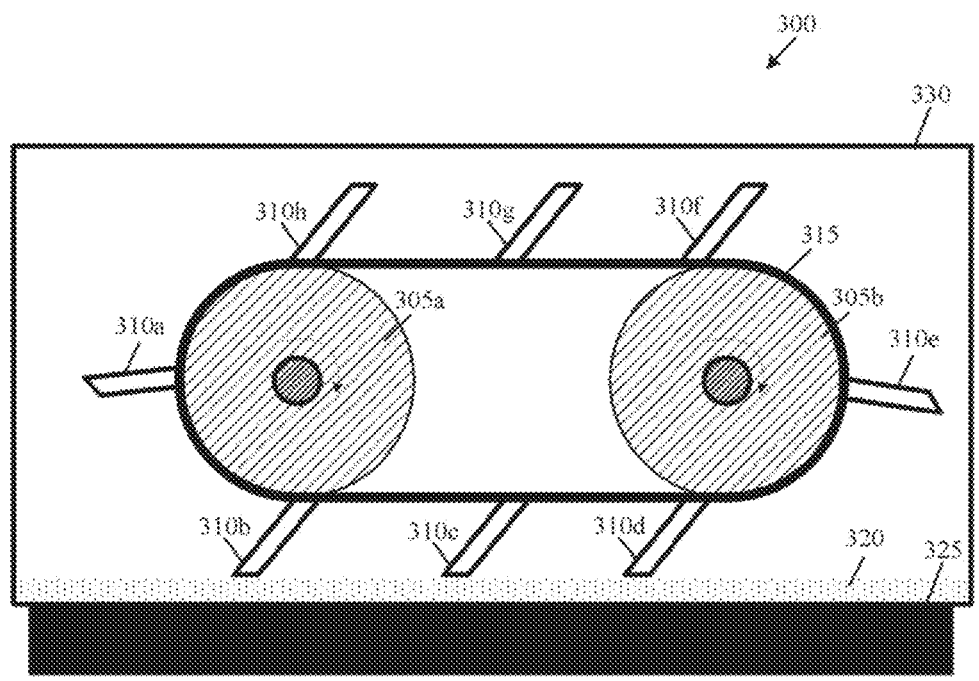
FIG. 3 depicts an illustrative thin film system according to a third embodiment.

FIG. 3 depicts an illustrative thin film system according to a third embodiment. As shown in FIG. 3, a thin film system 300 may include a chamber 330 having a fluid surface 325 configured to support a fluid 320. The horizontal thin film, system 300 may include a wheel-belt structure including two wheels 305a, 305b and a belt 315 wound around the two wheels. A driving element (not shown) may be configured to rotate at least one of the wheels 305a, 305b, thereby rotating the belt 315 and the wheel not directly rotated by the driving element. The belt 315 may include protrusions 310a-310h configured to contact at least a portion of the fluid 320 as the belt rotates about the wheels 305a, 305b. The protrusions 310a-310h may be configured to form the fluid 320 into a thin film as the belt rotates about the wheels 305a, 305b. In an embodiment, if the belt 315 has more protrusions 310a-310h, the rate of rotation required to generate a thin film of the fluid 320 may be lowered. Conversely, if the belt 315 has fewer protrusions 310a-310h, the rate of rotation required to generate a thin film of the fluid 320 may be increased.

In an embodiment, the thin film system 300 may be orientated vertically, in which the wheels 305a, 305b may be positioned in a vertical plane (for example, the wheel 305a positioned above the wheel 305b) instead of the horizontal plane depicted In FIG. 3. Vertical orientation embodiments of the thin film system 306 may be used due to various factors, such as space requirements, cooling targets (for example, in a condensation-evaporation based cooling system), the type of fluid 320, or the like. For example, the fluid 320 may be sufficiently viscous such that at least a portion of the thin film may be formed on the side walls of the chamber 330 in the vertical orientation embodiments.

Figure 4:
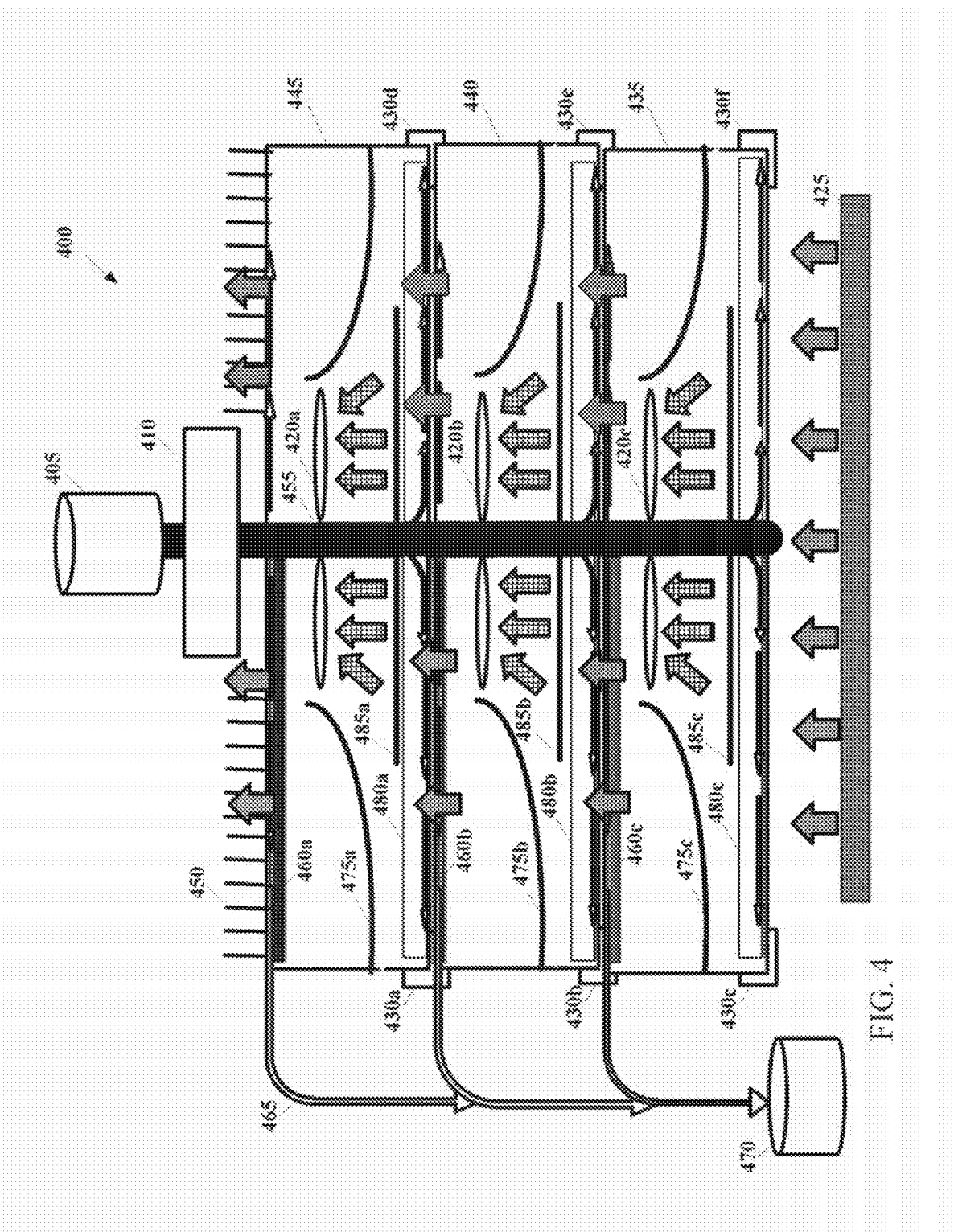
FIG. 4 depicts an illustrative condensation-evaporation system according to some embodiments.

FIG. 4 depicts an illustrative condensation-evaporation system according to some embodiments. In an embodiment, the condensation-evaporation system may be configured as a water treatment system. As shown in FIG. 4, a condensation-evaporation system 400 may include a supply of fluid 405 for use in the condensation-evaporation cycle of the condensation-evaporation system. For example, in a water treatment system, the fluid may include untreated water (for instance, salt water). The condensation-evaporation system 400 may include multiple tiers 435, 440, 445 having a generally similar configuration. A pipe system 455 may be configured to receive the fluid 405, for example, the fluid 405 may be directed to the pipe system 455 using a driving motor 410. The condensation-evaporation system 400 may further include a preheating apparatus 450.

The fluid 405 may be heated by a heater 425 and evaporate. The evaporated untreated water 405 may move through the water treatment system 400 condensing on a condensation surface 460a-460c on one of the tiers 435, 440, 445, depending on where it travels through the system. In various embodiments, the condensation surface 460a may be thermally connected to the preheating apparatus 450 and may be configured to provide heat from the condensation of vapor to the preheating apparatus 450. In some embodiments, the preheating apparatus 450 may be configured to receive fluid, such as fluid from areas surrounding the evaporation-condensation system 400. In some embodiments, the prehearing apparatus 450 may be configured to heat the fluid with the heat obtained from the condensation surface 460a. Each tier 435, 440, 445 may include various components, elements, and/or systems configured to facilitate the operation of the condensation-evaporation system 400. For example, the condensation surfaces 460a-460c may be associated with gas diffusion apparatuses 420a-420c configured to promote condensation, on each respective condensation surface. In an embodiment, the gas diffusion apparatuses 420a-420c may be formed as a fan-like apparatus configured to promote condensation by reducing an amount of non-condensable gas (NCG) adjacent to the condensation surfaces 460a-460c responsive to rotation of fan blades of the gas diffusion apparatuses 420a-420c.

In another example, anti-gas inserts 475a-475c may be positioned on the inside walls of the evaporation-condensation system 400. In some embodiments, the inserts 475a-475c may be shaped to funnel vapor (for example, evaporated fluid) from a large area to a smaller area that is focused near the center of the condensation surfaces 460a-460c. The funnel shape of the inserts 475a-475c may additionally acts to increase the velocity and/or momentum of the vapor travelling towards the condensation surfaces 460a-460c.

In a further example, the evaporation-condensation system 400 may include thin film wipers 480a-480c configured to form a thin film of the fluid on corresponding evaporation structures 485a-485c according to some embodiments described herein.

As the fluid moves through the evaporation-condensation system 400, unwanted material (for example, brine, dirt, or the like) may be collected at one or more collectors 430a-430f for removal from the evaporation-condensation system 400. The condensed fluid may be collected and travel through one or more treated water pathways 465 for collection in a treated water container 470.

In an embodiment, the pressures in all the tiers may be near atmospheric pressure. If degassing and pressure control are conducted, the evaporation-condensation process may be enhanced, allowing for more tiers. Various fluid treatment systems may operate according to the evaporation-condensation system 400 depicted in FIG. 4, such as a water distillation or desalination system.

Figure 5:
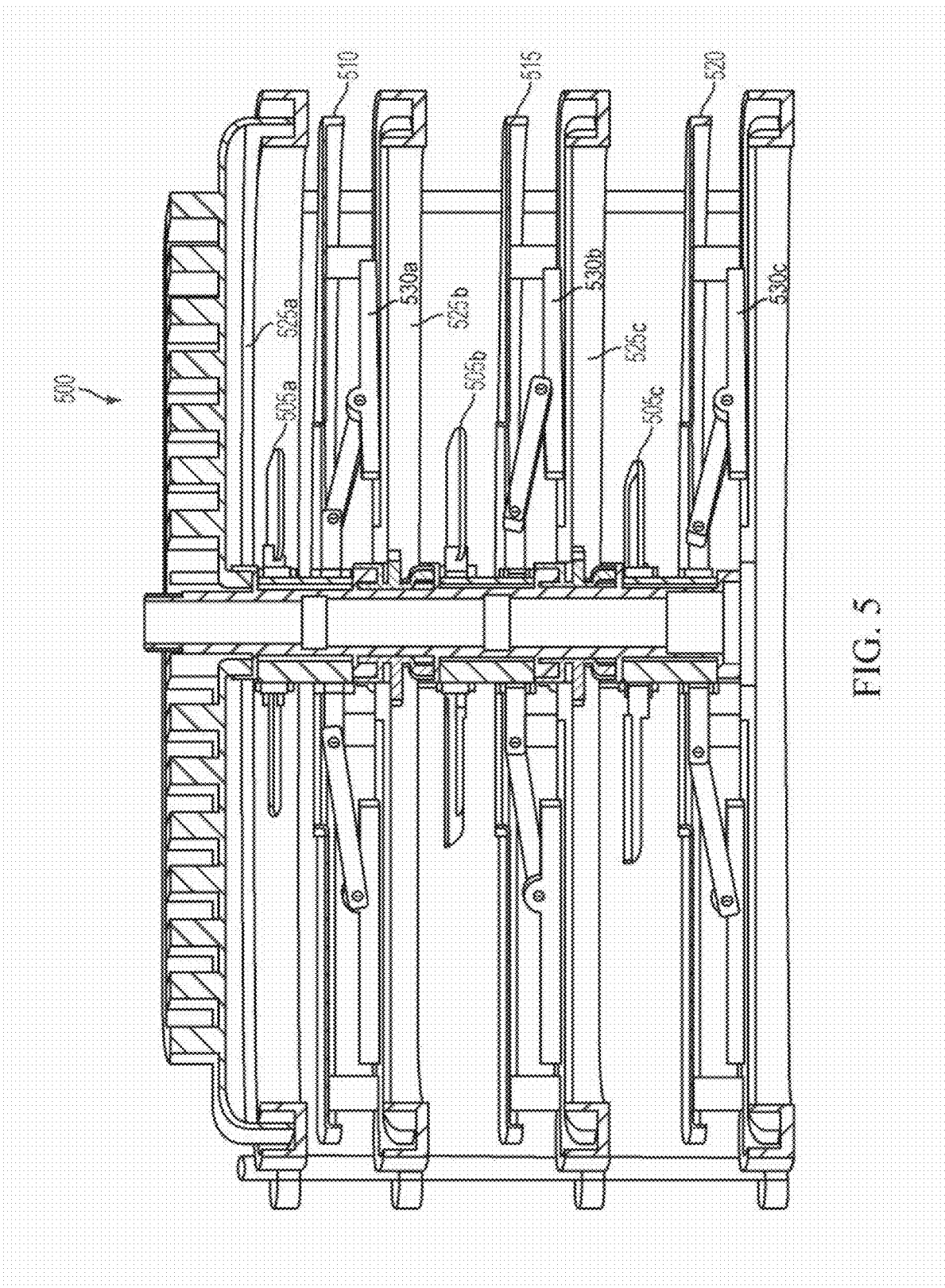
FIG. 5 depicts a cross-sectional side-view of an illustrative evaporation-condensation chamber according to some embodiments.

FIG. 5 depicts a cross-sectional side-view of an illustrative evaporation-condensation chamber according to some embodiments. As shown in FIG. 5, evaporation-condensation chamber 500 may comprise multiple tiers 510, 515, 520, similar to the system depicted in FIG. 4. In an embodiment the evaporation-condensation chamber 500 may be configured as a desalination chamber system. The evaporation-condensation chamber 500 may be enclosed within a casing (not shown).

In an embodiment, each tier 510, 515, 520 may be configured as a"pan," wherein the surface 525a-525c may serve as a condensation surface, an evaporation surface, or both for pans located above and/or below. For example, the upper surface 525a may serve as the condensation surface for tier 510, the top-most tier. The lower portion of surface 525b may serve as the condensation surface of tier 515 and the evaporation surface of tier 510, and so on.

In an embodiment, each upper tier, or stage, has a larger area than its respective lower tier such that the lower "pans" can be stored in the upper bigger pans. Each tier 510, 515, 520 may be configured as a module, such that tiers may be added or removed from the desalination chamber 500 to customize the system. The evaporation-condensation chamber 500 may be configured as a portable evaporation-condensation chamber, facilitated by the modularity of its components.

In an embodiment, each tier may be associated with one or more systems or components configured to facilitate evaporation of a fluid within the evaporation-condensation chamber 590. For example, gas diffusion apparatuses 505a-505c and/or thin film wipers 530a-530c may be included in one or more of the tiers 510-520. In an embodiment, the gas diffusion apparatuses 505a-505c, thin film wipers 530a-530c, and/or any other components may be manually operated or powered by a small electric motor as appropriate for a portable device.

Figure 6:
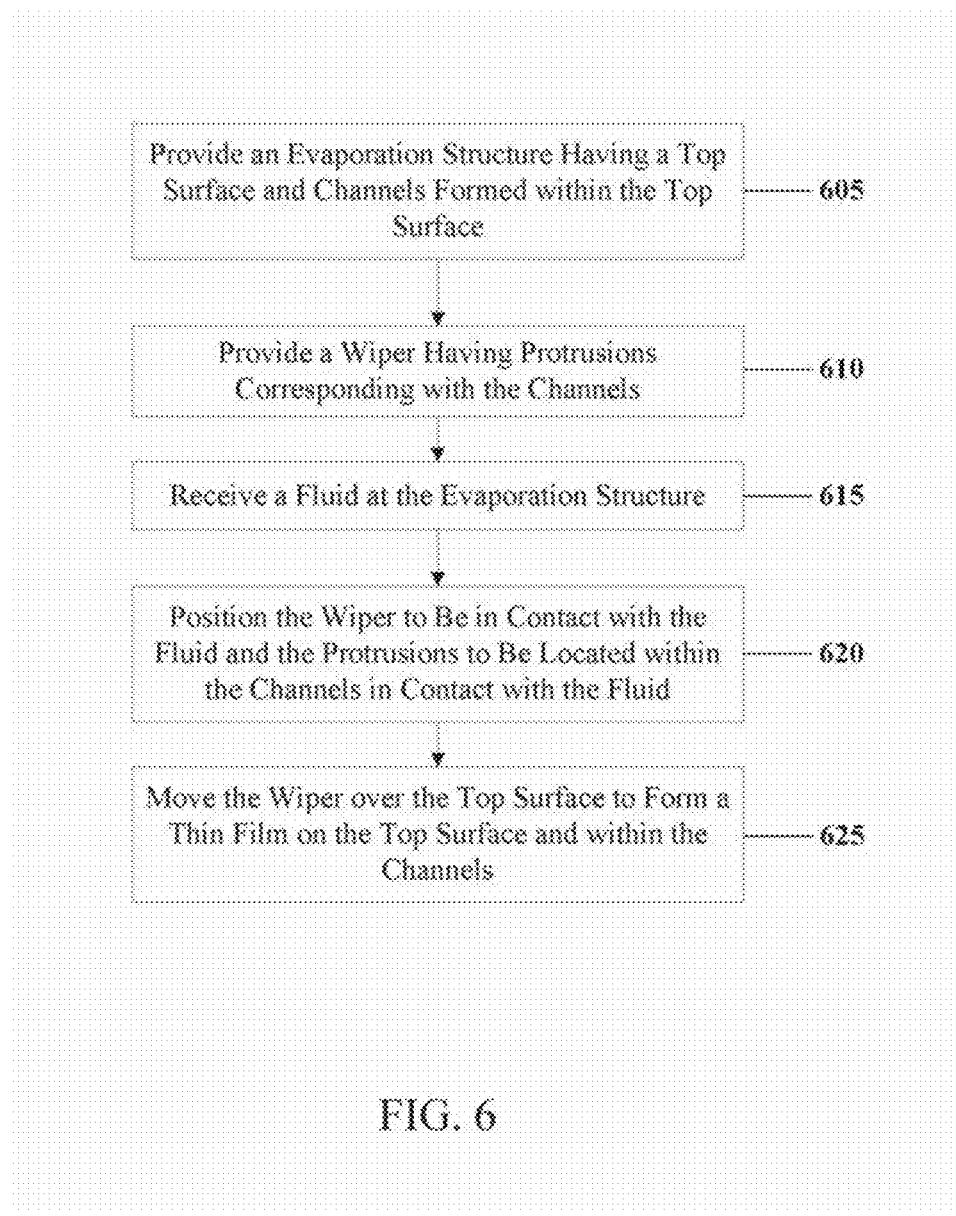
FIG. 6 depicts a flow diagram for an illustrative method of forming a thin film of fluid to promote evaporation of the fluid according to some embodiments.

FIG. 6 depicts a flow diagram for an illustrative method of forming a thin film of fluid to promote evaporation of the fluid according to some embodiments. The method described in FIG. 6 is for illustrative purposes as additional, fewer, and/or alternative steps are contemplated without departing from the scope of the present disclosure.

As shown, in FIG. 6, an evaporation structure may be provided 605 that includes a top surface and channels formed within the top surface. A wiper may be provided 610 having protrusions corresponding to the channels. A fluid may be received 615 at the evaporation structure. The wiper may be positioned 620 such that the wiper and the protrusions are in contact with the fluid. The wiper may be moved 625 over the top surface to form a thin film on the top surface and within the channels.

EXAMPLES

Example 1: Water Distillation Process Using Thin Film Wiper Systems

A water distillation facility will be equipped with 5 circular evaporation structures arranged within a distillation room, each having a diameter of about 3 meters and a thickness of about 0.5 meters. The evaporation structures will be formed of carbon steel. The evaporation structures will have 4 circular channels having a depth of about 5 centimeters and a width of about 8 centimeters formed within a top surface of the evaporation structures spaced about 0.5 meters apart starting from a central axis of each evaporation structure.

Each of the condensation structures will have two thin film wiper blades formed from carbon steel and an edge formed from a rubber material. The thin film wiper blades will include a protrusion for each channel formed from a polyvinyl chloride mesh structure. Each protrusion will have a height of about 4 centimeters and a width of about 7 centimeters. The thin film wiper blades will be operatively coupled to a central axis mechanically connected to a motor driving mechanism. The motor driving mechanism may be configured to rotate the central avis such that the thin film wiper blades rotate over the top surface and the protrusions move within the channels at about 20 revolutions per minute.

Untreated water will flow from a water source onto each of the evaporation structures at a rate substantially equivalent to the rate of evaporation of the water on the evaporation structures. The evaporation rate will be 10 liters per hour for each evaporation structure, producing an overall evaporation rate of 50 liters per hour for the distillation room. The thin film wiper blades will rotate over the top surface with the edge and the protrusions in contact with at least a portion of the water. The thin film wiper blades will form a thin film of water on the top surface of about 0.5 centimeters, and the protrusions will form a thin film of water within the channels of about 0.25 centimeters.

A heater will be located below each evaporation structure to heat the water, which will evaporate into water vapor that will travel toward a condensation system. The condensation system will cause the water vapor to condense into water which will travel to a central collection system. The formation of the thin film on the evaporation structures will increase the evaporation rate by 20% over a substantially similar sworn that does not use the thin film wiper blades. The formation of channel's within the evaporation structures and the use of the protrusions to form a thin film of water therein, allow the water distillation facility to use evaporation structures that are 30% smaller in size than would be required to achieve a similar evaporation rate without the channels and the protrusions.

Example 2: Horizontal Thin Film System

A computing system will include a heat transfer system configured to cool a central processing unit (CPU). The heat transfer system will be configured as a heat pipe having a chamber made of a nickel alloy and will have a thickness of about 100 millimeters, a width of about 2 centimeters, and a height of about 0.5 centimeters. The chamber will include an evaporation surface located on the side of the chamber contacting the CPU and a condensation surface on the opposite side of the chamber.

A belt system including a first wheel and a second wheel arranged on a horizontal plane and having a rubber belt wound around the first wheel and the second wheel will be arranged within the chamber. The first wheel will be mechanically coupled with an electric motor configured to rotate the first wheel, thereby causing the belt and the second wheel to rotate. The belt will be learned with ribbed protrusions on an outside surface thereof (the surface of the belt facing the evaporation surface and not the surface facing the first wheel and the second wheel). The ribbed protrusions will have a thickness of about 200 nanometers.

The evaporation surface will have ethanol disposed thereon. The belt will be positioned within the chamber such that the ribbed protrusions are in contact with a portion of the ethanol. Rotation of the belt will cause a thin film of the ethanol to be formed on the evaporation surface having a thickness of about 10 nanometers. The thin film of ethanol will evaporate and the resulting ethanol vapor will move toward the condensation surface and condense thereon, cooling the CPU. The condensing ethanol will flow back to the evaporation surface to complete the evaporation-condensation cycle.

The CPU will operate at a temperature of about 100° C. and will be in thermal communication with the evaporation side of the heat transfer system. Heat generated by the operation of the CPU will heat the evaporation side to about 78.5° C. The temperature of the condensation surface will be about 75° C. during operation of the CPU. The evaporation-condensation cycle generated through operation of the heat transfer system will reduce the temperature of the CPU to about 65° C. Forming the ethanol into a thin film on the evaporation surface will increase the evaporation rate of the ethanol by about 20%, thereby requiring less energy (for example, less than 0.5 Watts), a smaller chamber, and lower amount of ethanol to cool the CPU than a similar system that does not form the ethanol into a thin film on the evaporation surface and does not have channels formed in the evaporation surface.

In the above detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present disclosure is not to be limited in terms of the particular embodiments described in this application, which are intended as illustrations of various aspects. Many modifications and variations can be made without departing (row its spirit and scope, as will be apparent to those skilled in the art. Functionally equivalent methods and apparatuses within the scope of the disclosure. In addition to those enumerated herein, will be apparent to those skilled in the art from the foregoing descriptions. Such modifications and variations are intended to fall within the scope of the appended claims. The present disclosure is to be limited only by the terms of the appended claims, along with the foil scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singulars plural permutations may be expressly set forth herein for sake of clarity.

It will be understood by those within the art that, in general, terms used herein, and especially in the appended claims (for example, bodies of the appended claims) are generally intended as "open" terms (for example, the term "including" should be interpreted, as: "including but not limited to," the term "having" should be interpreted as "having at least," the term "includes" should be interpreted as "includes but is not limited to," et cetera). While various compositions, methods, and devices are described in terms of "comprising" various components or steps (interpreted, as meaning "including, but not limited to"), the compositions, methods, and devices can also "consist essentially of" or "consist of" the various components and steps, and such terminology should be interpreted as defining essentially closed-member groups. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such, as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, et cetera" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, et cetera). In those instances where a convention analogous to "at least one of A, B, or C, et cetera" is used, in general such a construction is intended in the sense one having skill in the art would understand the convention (for example, "a system having at least one of A, B, or C" would include hut not be limited to systems that have A alone, B alone, C alone, A and B together, A and C together, B and C together, and/or A, B, and C together, et cetera). It will be further understood by those within the art that virtually any disjunctive word and/or phrase presenting, two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, et cetera As a non-limiting example, each range discussed herein can be readily broken, down into a lower third, middle third and upper third, et cetera As will also be understood by one skilled in the art all language such as "up to," "at least" and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Various of the above-disclosed and other features and functions, or alternatives thereof may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. A thin film system configured to form a thin film of a fluid to promote evaporation of the fluid, the system comprising:
    an evaporation structure configured to facilitate evaporation of a fluid on a top surface thereof and within at least one channel formed within the top surface; and
    at least one wiper blade comprising at least one protrusion corresponding to the at least one channel, the at least one wiper being configured to move over the top surface with at least a portion of the at least one protrusion moving within the at least one channel, wherein the at least one wiper blade and the at least one protrusion are in contact with at least a portion of the fluid to form a thin film of the fluid on the top surface and within the at least one channel.

2. The system of claim 1, wherein the fluid comprises at least one of water, ammonia, refrigeration fluids, hydrocarbons, methanol, ethanol, petroleum distillates, benzene, and toluene.

3. The system of claim 1, wherein the thin film system is configured as part of one of a heat pipe, a condenser, a vapor chamber, a desalination system, a capillary-pumped loop, a distillation system, a chemical separation system, and an electronics cooling system.

4. The system of claim 1, wherein the thin film system is configured as part of a computing device central processing unit cooling system.

5. The system of claim 1, wherein the evaporation structure is configured as a substantially circular structure having a substantially flat top surface, wherein the at least one channel comprises at least one groove concentric with the evaporation structure.

6. The system of claim 5, wherein the at least one wiper blade is configured to rotate about a central axis of the evaporation structure.

7. The system of claim 6, wherein the at least one wiper blade is configured to rotate at about 5 revolutions per minute to about 500 revolutions per minute.

8. The system of claim 1, wherein the evaporation structure is configured as a substantially quadrilateral-shaped structure having a substantially flat top surface.

9. The system of claim 1, wherein the at least one wiper blade is configured to form a thin film of the fluid having a thickness of about 10 nanometers to about 1 centimeter.

10. The system of claim 1, wherein the at least one channel has a depth of about 0.1 millimeters to about 10 centimeters.

11. The system of claim 1, wherein the at least one channel has a width of about 0.1 millimeters to about 10 centimeters.

12. The system of claim 1, wherein the at least one wiper blade comprises at least one of aluminum, steel, and polyvinyl chloride.

13. The system of claim 1, wherein the at least one wiper blade comprises an elastic sponge edge positioned at a lower portion of the at least one wiper blade in contact with at least a portion of the fluid.

14. The system of claim 1, wherein at least a portion of the at least one wiper comprises a porous brush.

15. The system of claim 1, wherein the at least a portion of the at least one protrusion comprises a porous brush.

16. The system of claim 1, wherein the at least one wiper blade comprises a plurality of wiper blades.

17. A method of forming a thin film of a fluid to promote evaporation of the fluid, the method comprising:
    providing an evaporation structure configured to facilitate evaporation of a fluid on a top surface thereof and within at least one channel formed within the top surface;
    providing at least one wiper blade comprising at least one protrusion corresponding to the at least one channel;
    receiving the fluid at the evaporation structure;
    positioning the at least one wiper blade such that the at least one wiper blade is in contact with at least a portion of the fluid and at least a portion of the at least one protrusion is located within the at least one channel in contact with at least a portion of the fluid; and
    moving the at least one wiper blade over the top surface to form a thin film of the fluid on the top surface and within the at least one channel.

18. The method of claim 17, further comprising configuring the at least one wiper blade to form the thin film of the fluid having a thickness of about 0.01 millimeters to about 1 centimeter.

19. The method of claim 17, wherein moving the at least one wiper blade over the top surface comprises rotating the at least one wiper blade around a central axis of the evaporation structure.

20. The method of claim 19, wherein moving the at least one wiper blade comprises rotating the at least one wiper blade at about 5 revolutions per minute to about 500 revolutions per minute.

* * * * *